United States Patent [19]

Castel

[11] 4,167,805

[45] Sep. 18, 1979

[54] CUPROUS SULFIDE LAYER FORMATION FOR PHOTOVOLTAIC CELL

[75] Inventor: Egil D. Castel, El Paso, Tex.

[73] Assignee: Photon Power, Inc., El Paso, Tex.

[21] Appl. No.: 925,472

[22] Filed: Jul. 17, 1978

[51] Int. Cl.² .................... H01L 31/18; H01L 31/04
[52] U.S. Cl. ..................................... 29/572; 427/74;
  427/123; 427/126; 427/399; 427/430 B; 136/89 CD
[58] Field of Search ................. 427/74, 123, 126, 399, 427/430 B; 27/572; 136/89 CD

[56] References Cited

U.S. PATENT DOCUMENTS

| | | | |
|---|---|---|---|
| 3,374,108 | 3/1968 | Keramidas | 427/74 |
| 3,416,956 | 12/1968 | Keramidas | 427/74 |
| 3,884,779 | 5/1975 | Duy | 427/74 |
| 3,888,697 | 6/1975 | Bogus | 427/74 |
| 3,975,211 | 8/1976 | Shirland | 427/74 |
| 4,086,779 | 4/1978 | Jordan | 136/89 CD |

OTHER PUBLICATIONS

TeVilde, "Production ... Solid State Reaction", Energy Conversion, vol. 15, pp. 111-115, (7-1975).

Primary Examiner—Michael F. Esposito
Attorney, Agent, or Firm—Bard & Groves

[57] ABSTRACT

An improved method for fabrication of a photovoltaic cell preferably of the CdS—$Cu_xS$ type, having a copper electrode adjacent the $Cu_xS$. A portion of the CdS is converted to $Cu_xS$ through ion exchange wherein the CdS is immersed in a first solution of cuprous ions and a second solution of cupric ions to produce a non-stoichiometric $Cu_xS$. A layer of metallic copper is applied by conventional techniques, such as vacuum deposition, and the photovoltaic cell heat treated to affect formation of the CdS—$Cu_xS$ heterojunction. Metallic copper diffusing through the CdS and $Cu_xS$ from the electrode is captured by the non-stoichiometric $Cu_xS$ whereby the $Cu_xS$ is substantially stoichiometric in the completed photovoltaic cell.

12 Claims, No Drawings

CUPROUS SULFIDE LAYER FORMATION FOR PHOTOVOLTAIC CELL

FIELD OF THE INVENTION

This invention relates to $CdS-Cu_xS$ photovoltaic cells and, more particularly, to a method for forming the $Cu_xS$ to compensate for metallic copper diffusion from a copper electrode layer

BACKGROUND OF THE INVENTION

The development of cadmium sulfide (CdS)—cuprous sulfide ($Cu_xS$) photovoltaic cells comprises a rapidly developing technology. The component layers may be formed by vacuum deposition, spray and dipping processes which are adaptable to volume production of large area photovoltaic panels.

A completed photovoltaic panel is formed from a plurality of thin films superposed on a common substrate. The selected substrate generally has at least one electrically conductive surface and may be transparent.

A first semiconductor material is formed over the substrate by techniques well known in the art such as vacuum deposition, sputtering, sintering, or spraying. In the present invention, the semiconductor may be CdS or a solid solution of CdS and another sulfide, such as ZnS.

Next, cuprous sulfide is formed over the semiconductor layer and a heterojunction obtained between the cuprous sulfide and the semiconductor. Finally, a conductive layer is deposited over the heterojunction to form the positive electrode.

It is well known that the stoichiometry of the $Cu_xS$ layer is an important factor in the energy conversion efficiency of the heterojunction. $Cu_xS$ occurs in several phases such as $Cu_{2.00}S$ (chalcocite), $Cu_{1.95}S$ (djurleite), and $Cu_{1.80}S$ (digenite). Stoichiometric $Cu_2S$ (chalcocite) is required for high efficiency photovoltaic cells. It has been found that efficiency decreases by 40% for djurleite and 90% for digenite.

A conventional technique for forming the $Cu_xS$ layer uses ion exchange to replace cadmium with copper through the reaction:

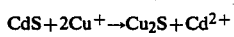

$$CdS + 2Cu^+ \rightarrow Cu_2S + Cd^{2+}$$

The reaction may be accomplished by immersing the layer of CdS in a cuprous dip such as described in U.S. Pat. Nos. 3,374,108 and 3,416,956 to Keramidas.

The actual stoichiometry of the $Cu_xS$ layer formed from the cuprous solution is not equal to the theoretical value $X=2$. Oxidation of cuprous ions in the solution and of the resulting cuprous sulfide layer result in $X<2$. Prior art attempts to improve the stoichiometry have frequently produced metallic copper in the photovoltaic layers. The presence of metallic copper acts to degrade cell performance and negates gains produced by the improved stoichiometry.

Yet another cause of metallic copper diffused into the photovoltaic layers is the use of copper as the positive electrode. Upon completing the photovoltaic cell, it is generally necessary to heat treat the cell to complete formation of the heterojunction. Metallic copper from the electrode readily diffuses into the cell during this heat treatment and produces the undesirable degradation in cell performance.

Copper has many other desirable characteristics for $CdS-Cu_xS$ photovoltaic cell application including cost, ease of application, and material compatibility.

The disadvantages of the prior art are overcome by the present invention, however, and improved methods are provided for manufacturing $CdS-Cu_xS$ photovoltaic cells having copper positive electrodes.

SUMMARY OF THE INVENTION

In a preferred embodiment of the present invention, a $CdS-Cu_xS$ photovoltaic cell is formed by a process which includes both a cuprous dip and a cupric dip for forming a layer of $Cu_{2-\beta}S$. Application of a copper electrode and subsequent heat treatment diffusing copper into the $Cu_{2-\beta}S$ permits the diffusing copper to react with the $Cu_{2-\beta}S$ to form $Cu_2S$ and to minimize the presence of metallic copper in the CdS.

A CdS film is immersed in a first cuprous solution to form $Cu_{2-\alpha}S$, where $\alpha$ is small. The stoichiometry of the $Cu_{2-\alpha}S$ layer is then decreased a predetermined amount by immersing the $Cu_{2-\alpha}S$ in a cupric solution to form $Cu_{2-\beta}S$, where $\beta > \alpha$.

An advantage of the present invention is to accommodate use of copper as a positive electrode in a $CdS-Cu_xS$ photovoltaic cell.

Another advantage is that the stoichiometry of the $Cu_xS$ can be controlled by varying the ratio of CdS immersion times in the cuprous and cupric solutions.

Yet another advantage is that deep penetration of the $Cu_xS$ along CdS grain boundaries is avoided and a high internal cell shunt resistance is maintained.

One other advantage is that a highly stoichiometric layer of $Cu_xS$ is formed to maximize the energy conversion efficiency of the cell.

These and other features and advantages of the present invention will become apparent from the following detailed description.

DETAILED DESCRIPTION

A completed photovoltaic cell of the $CdS-Cu_xS$ variety generally consists of a variety of "layers". A particular layered configuration for a back wall photovoltaic cell will be discussed herein but it should be understood that the disclosed invention may be practiced on any polycrystalline layer of CdS or the like. Further, various solid solutions, such as $CdS-ZnS$, may be used as a semiconductor material and are intended to be within the scope of the invention.

In accordance with one embodiment of the present invention, a substrate coated with polycrystalline cadmium sulfide (CdS) is provided. The layer of CdS may be produced by a variety of processes, including vacuum deposition, sintering, sputtering, or spraying.

Two solutions are now used for immersing, or dipping, the CdS to form $Cu_{2-\beta}S$. A first cuprous solution forms substantially $Cu_2S$ and a second cupric solution then degrades the stoichiometry a predetermined amount. The desired $\beta$ may be experimentally determined whereby the completed photovoltaic cell includes a stoichiometric layer of $Cu_xS$, i.e., chalcocite, and a copper positive electrode without metallic copper in the polycrystalline CdS layer.

In the cuprous solution, cadmium is replaced by copper through an ion exchange mechanism, as hereinabove discussed. A variety of suitable cuprous solutions can be formed by dissolving a cuprous salt in water. Cuprous chloride, cuprous bromide and cuprous iodide have been used in the prior art. Improved solubility of the cuprous salts has been obtained by including NaCl, $NH_4Cl$, KCl, LiCl, KBr, NaBr, NaI or $NH_4Br$.

It has been found that the first solution will produce substantially stoichiometric $Cu_xS$, where X is about 1.97. As hereinabove discussed, oxidation effects will generally not permit X=2. Typical first cuprous solutions which have been used are as follows:

EXAMPLE I 100 ml: $H_2O$
7 ml: $HNO_3$ (5-1)
1.5 gm: Tartaric Acid
1.5 gm: CuCl
1.5 gm: NaCl

EXAMPLE II 1000 ml: $H_2O$
20 gm: NaCl
20 gm: Sodium Acetate
2 gm: Ascorbic Acid
3 gm: CuCl
1.5 gm: Acetic Acid (pure)

EXAMPLE III 700 ml: $H_2O$
7 gm: Citric Acid (monohydrate)
30 gm: $NH_4Cl$
3.5 gm: CuCl In Examples I, II and III, typical organic acids are shown and tartaric, citric, ascorbic or lactic acid might be used in either example. The solution may be maintained at room temperature and the preferred immersion time is typically about 3 minutes. Immersion times of 2–4 minutes produce operable results. The $Cu_xS$ thickness is insufficient where the immersion time is less than 2 minutes and is excessive where the immersion time is greater than 4 minutes. Example II presents a preferred solution.

The resulting layer is next immersed in cupric ions to degrade the stoichiometry of the cuprous sulfide. The degradation mechanism is thought to occur through the following reaction:

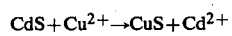
$$CdS + Cu^{2+} \rightarrow CuS + Cd^{2+}$$

The CuS, in turn, forms a solid solution with $Cu_2S$ to produce the overall stoichiometry of $Cu_{2-\beta}S$. The degree of degradation desired depends on the final heat treatment required after the copper electrode is applied by conventional techniques such as vacuum deposition. The higher the temperature and longer the duration of the treatment, the more copper will diffuse and which should be accommodated. These parameters must be determined for any given fabrication process. Typical heat treatment temperatures are 400°–500° F.

During the cell heat treatment, the diffusing copper reacts with the $Cu_xS$:

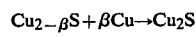
$$Cu_{2-\beta}S + \beta Cu \rightarrow Cu_2S$$

Thus, the diffusing copper is precluded from diffusing through the $Cu_xS$ and into the CdS.

As shown by the following examples, the cupric solutions may be formulated as follows:

TABLE A

| | |
|---|---|
| Cupric salt | cupric chloride, sulfate or acetate |
| pH | 1.2 to 5.5 |
| Concentration | $7.10 \times 10^{-3}M$ to $6.10 \times 10^{-2}M$ |
| Electrolyte | chlorides, e.g. ammonium and sodium; perchlorates, e.g. lithium |
| Concentration of electrolyte | about 5 × salt concentration mole/mole ratio |

In each of the following examples, a layer of CdS was first immersed in a cuprous solution formulated according to Example II above. The immersion time was 3 minutes. The resulting CdS—$Cu_xS$ structure was then immersed in cupric solutions set out in the following examples to form a highly non-stoichiometric $Cu_xS$.

The resulting structure was then coated with metallic copper and heat treated to form the CdS—$Cu_xS$ heterojunction. The heat treatment was done in a vacuum and at a temperature of about 220° C. for a time of 5–10 minutes. Table B illustrates the immersion times for each cupric solution example and the resulting photovoltaic conversion efficiency for each cell after heat treatment.

EXAMPLE IA

A cupric solution was prepared in the following formula:

700 ml: $H_2O$
6.25 gm: $CuSO_4.5H_2O$
15 gm: NaCl
HCl was added to adjust pH=5.5.

The range of pH is limited since, for pH>5.5, cupric ions precipitate as cupric hydroxide and, for pH<1.2, the shunt resistance of the photovoltaic becomes very low due to deep penetration in the CdS grain boundaries. These limits were confirmed by the following:

EXAMPLE IB

Same formula as Example IA with HCl in an amount to provide pH=4.5.

EXAMPLE IC

Same formula as Example IA with HCl in an amount to provide pH=3.0.

EXAMPLE ID

Same formula as Example IA with HCl in an amount to provide pH=2.0.

EXAMPLE IE

Same formula as Example IA with HCl in an amount to provide pH=1.2.

EXAMPLE IIA

A preferred standard solution is the following:
700 ml: $H_2O$
9 gm: citric acid
3 gm: $NH_4Cl$
5 gm: Cupric acetate monohydrate To check the effects of cupric ion concentrations, the following variations of the standard solution were prepared and satisfactorily used:

EXAMPLE IIB 700 ml: $H_2O$
9 gm: citric acid
3 gm: $NH_4Cl$
1 gm: cupric acetate monohydrate

EXAMPLE IIC 700 ml: $H_2O$
18 gm: citric acid 6 gm: NH₄Cl
8.5 gm: cupric acetate monohydrate

EXAMPLE III

A chloride based cupric salt was prepared as follows:
700 ml: H$_2$O
2 gm: cupric chloride dihydrate
9 gm: citric acid
3 gm: NH$_4$Cl

EXAMPLE IV

The use of a perchlorate as a supporting electrolyte was demonstrated by the following solution:
700 ml: H$_2$O
5 gm: cupric acetate monohydrate
20 gm: Li ClO$_4$
pH adjusted to 3.5 using perchloric acid.

The above solutions were used to obtain the following results:

TABLE B

|     | Immersion Time (minutes) | Photovoltaic Efficiency % (uncorrected) |
| --- | --- | --- |
| IA  | 3  | 3.3 |
| IB  | 3  | 3.4 |
| IC  | 3  | 3.5 |
| ID  | 3  | 3.4 |
| IE  | 3  | 3.0 |
| IIA | 3  | 3.6 |
| IIB | 12 | 3.2 |
| IIC | 2  | 3.3 |
| III | 6  | 3.2 |
| IV  | 3  | 3.4 |

The results illustrated in Table B indicate that acceptable efficiencies are obtained over the formulation ranges set out in Table A.

It is therefore apparent that the present invention is one well adapted to obtain all of the advantages and features hereinabove set forth, together with other advantages which will become obvious and inherent from a description of the process itself. It will be understood that certain combinations and subcombinations are of utility and may be employed without reference to other features and subcombinations. This is contemplated by and is within the scope of the present invention.

What is claimed is:

1. In a process for manufacturing a CdS—Cu$_x$S photovoltaic cell having a copper positive electrode, a method for forming a film of Cu$_x$S on a layer of CdS, comprising the steps of:

immersing said layer of CdS in a first solution containing cuprous ions to convert a portion of said CdS to Cu$_{2-\alpha}$S; and thereafter
   immersing said CdS and Cu$_{2-\alpha}$S in a second solution containing cupric ions to form Cu$_{2-\beta}$S, where $\beta$ is greater than $\alpha$.

2. A method according to claim 1, including immersing in said second solution for a time effective to form digenite.

3. A method according to claim 1 or claim 2, including immersing in a second solution comprising a cupric salt and an electrolyte in an aqueous solution.

4. A method according to claim 3, wherein said cupric salt is selected from the group consisting of cupric chloride, cupric sulfate and cupric acetate.

5. A method according to claim 3, wherein said electrolyte is selected from the group consisting of ammonium chloride, sodium chloride and lithium perchlorate.

6. A method according to claim 3, wherein said electrolyte concentration is at least five times said cupric salt concentration.

7. A method of completing a CdS—Cu$_x$S photovoltaic cell on a substrate having a layer of CdS, including the steps of:

immersing said layer of CdS in a first solution containing cuprous ions to convert a portion of said CdS to Cu$_{2-\alpha}$S;
   immersing said CdS and Cu$_{2-\alpha}$S in a second solution containing cupric ions to form Cu$_{2-\beta}$S, where $\beta > \alpha$;
   forming a layer of metallic copper superposed above said CdS and Cu$_{2-\beta}$S to provide a positive electrode; and thereafter
   heating to a temperature effective to convert said Cu$_{2-\beta}$S to substantially Cu$_2$S as metallic copper diffuses into said Cu$_{2-\beta}$S and to form a CdS—Cu$_2$S photovoltaic junction.

8. A method according to claim 7, including immersing in said second solution for a time effective to form $\beta$ to a value effective for reacting with said copper to substantially react all of said copper diffusing into said Cu$_{2-\beta}$S during said heating.

9. A method according to claim 7 or 8, including immersing in a second solution comprising a cupric salt and an electrolyte in an aqueous solution.

10. A method according to claim 9, wherein said cupric salt is selected from the group consisting of cupric chloride, cupric sulfate and cupric acetate.

11. A method according to claim 9, wherein said electrolyte is selected from the group consisting of ammonium chloride, sodium chloride and lithium perchlorate.

12. A method according to claim 9, wherein said electrolyte concentration is at least five times said cupric salt concentration.

* * * * *